(12) United States Patent  
Park et al.

(10) Patent No.: US 8,933,453 B2  
(45) Date of Patent: Jan. 13, 2015

(54) ROUTING FOR HIGH RESOLUTION AND LARGE SIZE DISPLAYS

(75) Inventors: Youngbae Park, San Jose, CA (US); Shih Chang Chang, Cupertino, CA (US); Vasudha Gupta, Cupertino, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/598,325

(22) Filed: Aug. 29, 2012

(65) Prior Publication Data

US 2014/0061652 A1 Mar. 6, 2014

(51) Int. Cl.
*H01L 21/86* (2006.01)

(52) U.S. Cl.
USPC .............................................. 257/59; 257/72

(58) Field of Classification Search
USPC ....................... 257/59, 72, E21.656
See application file for complete search history.

(56) References Cited

U.S. PATENT DOCUMENTS

| | | |
|---|---|---|
| 5,831,283 A | 11/1998 | Batey et al. |
| 6,466,289 B1 * | 10/2002 | Lee et al. ................. 349/141 |
| 8,013,970 B2 * | 9/2011 | Seo et al. ................. 349/141 |
| 2006/0202934 A1 | 9/2006 | Shin et al. |
| 2010/0079695 A1 | 4/2010 | Um et al. |
| 2010/0289023 A1 * | 11/2010 | Choi et al. .................. 257/59 |
| 2011/0073864 A1 | 3/2011 | Liu et al. |
| 2013/0128167 A1 * | 5/2013 | Shih et al. .................. 349/42 |
| 2013/0306973 A1 * | 11/2013 | Youn et al. .................. 257/59 |

FOREIGN PATENT DOCUMENTS

KR 2006068442 A 6/2006

* cited by examiner

*Primary Examiner* — Whitney T Moore  
(74) *Attorney, Agent, or Firm* — Fletcher Yoder PC

(57) ABSTRACT

Embodiments of the present disclosure related to electronic displays and electronic devices incorporating such displays which employ a device, method, or combination thereof for reducing the width of gate lines and/or data lines in the display. The result of which allows for increased pixel aperture size. The present disclosure provides techniques for reducing the width of gate lines and/or data lines while maintaining an acceptable resistance level in the gate lines and/or data lines.

12 Claims, 8 Drawing Sheets

ROUTING FOR HIGH RESOLUTION AND LARGE SIZE DISPLAYS

BACKGROUND

The present disclosure relates generally to electronic displays and, more particularly, to configurations of gate and data lines in electronic displays that allow for increased pixel aperture size.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic displays, such as liquid crystal displays (LCDs) or organic light emitting diode (OLED) displays, are commonly used in electronic devices such as televisions, computers, phones, tablets, and the like. Generally, such displays are made up of a large number of pixels. Each pixel may be configured to display certain colors at certain times in order to produce images. In order to control the pixels, voltage is sent to the pixels at certain times via a wiring scheme made of gate lines and data lines. Generally, gate lines and data lines create a grid on the display, forming pixel apertures in the open areas. The areas of the display covered by the gate lines and data lines generally do not let light through. Thus, because every pixel is generally surrounded by gate and data lines, the amount of the display that is capable of displaying information if limited by the width of the gate and data lines. Further, the width of the gate lines affects an RC delay of the gate lines.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to devices and methods for reducing the width of gate lines and/or data lines in a display such that pixel aperture size can be increased and an RC delay can be decreased, thereby increasing image quality of the display. By way of example, one embodiment may include a gate line having a primary portion and a secondary portion, in which the secondary portion is disposed above the primary portion such that the width of the gate line can be decreased. However, because of the secondary portion and the primary portion are conductively coupled, the increase in resistance that may otherwise result from decreasing the width of the gate line may be compensated for by the addition of the secondary portion. Furthermore, in certain embodiments, the secondary portion may be made of a material with a lower resistance than the primary portion.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, embodiments of the present disclosure relate to electronic displays and electronic devices incorporating such displays which employ a device, method, or combination thereof for reducing the width of gate lines and/or data lines in the display. The result of which allows for increases pixel aperture size. The present disclosure provides techniques for reducing the width of gate lines and/or data lines while maintaining an acceptable resistance level in the gate lines and/or data lines. Specifically, the gate lines and/or data lines are supplemented with an alternate routing path which allows voltage to flow through the alternate routing path. Thus, the additional routing allows the original gate lines and/or data lines to be decreased in width and a decrease in an RC delay. In certain embodiments, the additional routing is made of a relatively low resistance metal such as copper.

Specific examples of the configuration of the alternate routing as well as configurations of the original gate lines and data lines will be discussed in this disclosure. For purposes of consistency and clarity, the original gate lines and data lines will be referred to as "primary data line" and "primary gate line", and the additional gate lines and date lines will be referred to as "secondary data line" and "secondary gate line".

Figure 1:
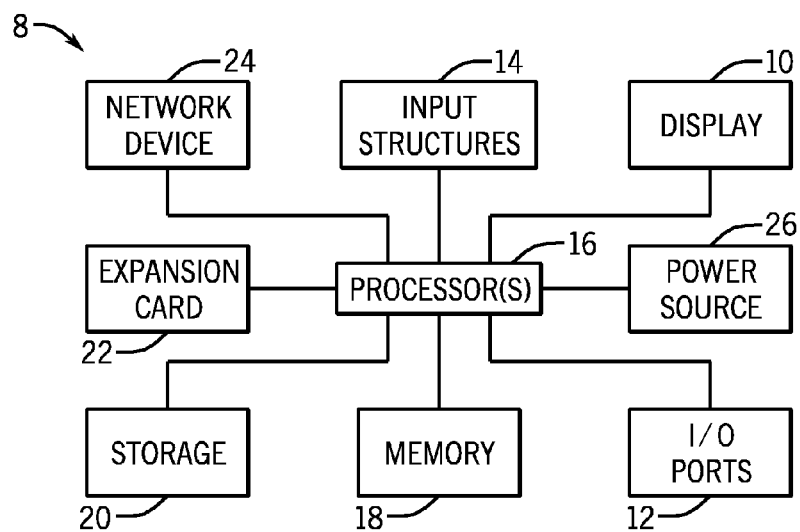
FIG. 1 is a block diagram of exemplary components of an electronic device, in accordance with aspects of the present disclosure.
Figure 3:
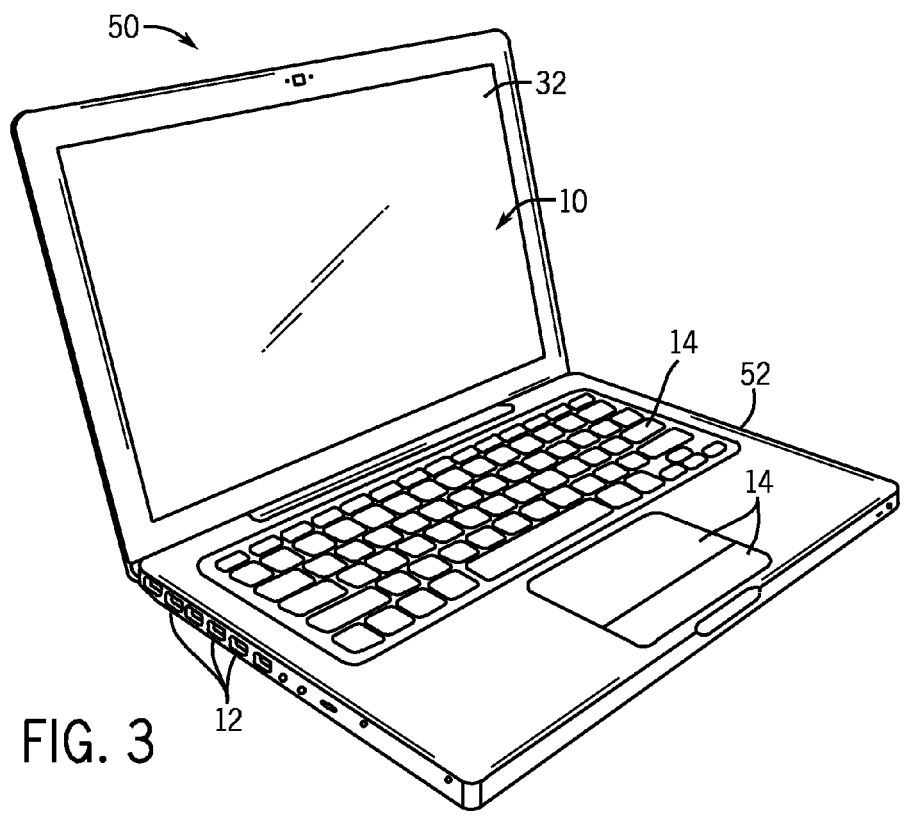
FIG. 3 is a view of a computer in accordance with aspects of the present disclosure.
Figure 2:
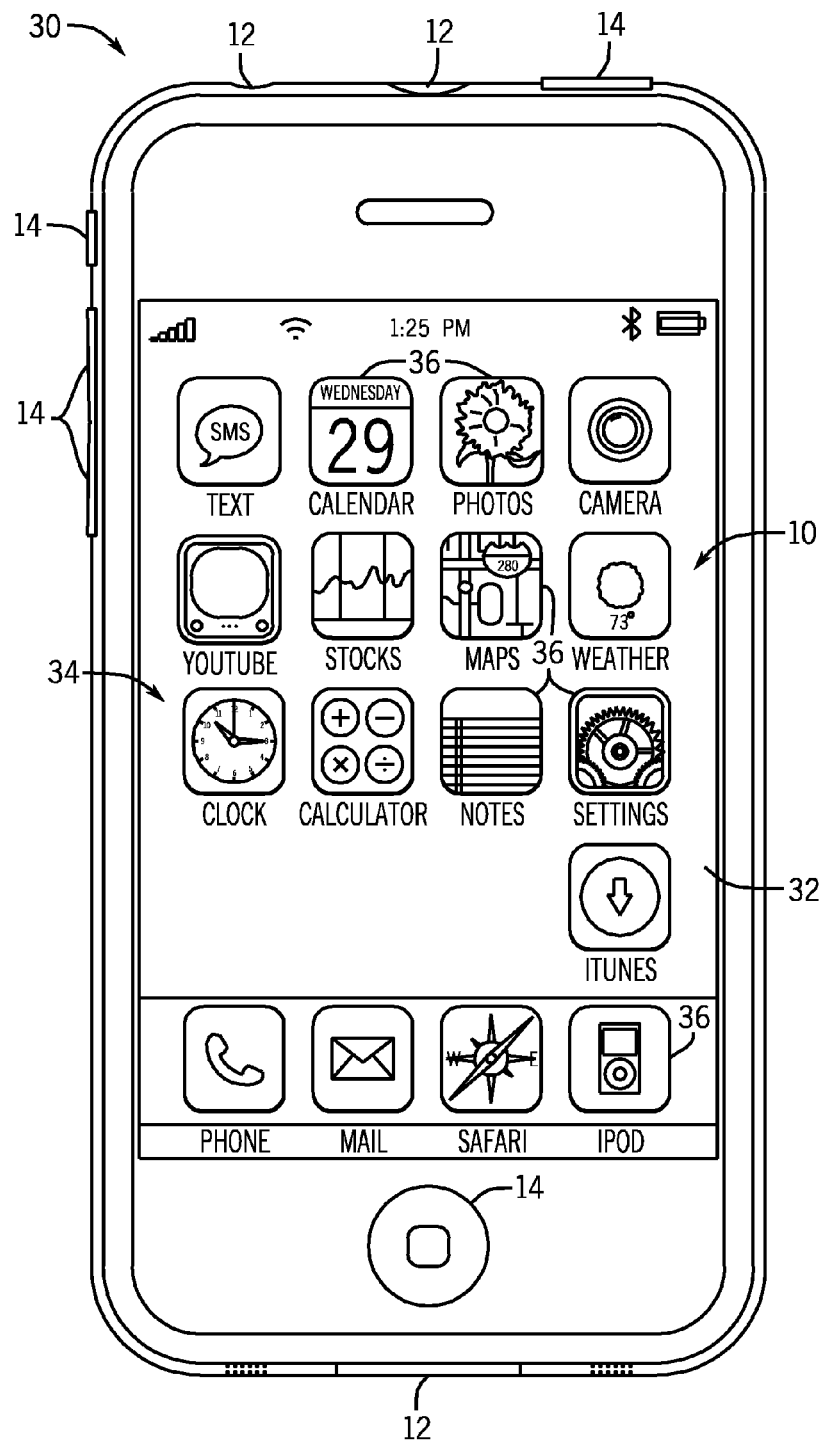
FIG. 2 is a front view of a handheld electronic device in accordance with aspects of the present disclosure.

With the foregoing in mind, a general description of suitable electronic devices that may employ electronic displays having gate lines and/or data lines with decreased width, and thus increased pixel aperture size, is described below. In particular, FIG. 1 is a block diagram depicting various components that may be present in an electronic device suitable for use with such a display. FIGS. 2 and 3 respectively illustrate perspective and front views of a suitable electronic device, which may be, as illustrated, a notebook computer or a handheld electronic device.

FIG. 1 is a block diagram illustrating the components that may be present in such an electronic device 8 and which may allow the device 8 to function in accordance with the techniques discussed herein. Those of ordinary skill in the art will appreciate that the various functional blocks shown in FIG. 1 may comprise hardware elements (including circuitry), software elements (including computer code stored on a computer-readable medium) or a combination of both hardware and software elements. It should further be noted that FIG. 1 is merely one example of a particular implementation and is merely intended to illustrate the types of components that may be present in a device 8. For example, in the presently illustrated embodiment, these components may include a display 10, I/O ports 12, input structures 14, one or more processors 16, a memory device 18, a non-volatile storage 20, expansion card(s) 22, a networking device 24, and a power source 26. As will be appreciated, the overall quality of the display 10 may be affected by the size of the pixel apertures of the display 10.

With regard to each of these components, the display 10 may be used to display various images generated by the device 8. In one embodiment, the display 10 may be a liquid crystal display (LCD), while in another embodiment, the display 10 may be an organic light emitting diode (OLED) display. Additionally, in certain embodiments of the electronic device 8, the display 10 may be provided in conjunction with a touch-sensitive element, such as a touch screen, that may be used as part of the control interface for the device 8.

The I/O ports 12 may include ports configured to connect to a variety of external devices, such as a power source, headset or headphones, or other electronic devices (e.g., such as handheld devices and/or computers, printers, projectors, external displays, modems, docking stations, and so forth). The I/O ports 12 may support any interface type, such as a universal serial bus (USB) port, a video port, a serial connection port, an IEEE-1394 port, an Ethernet or modem port, and/or an AC/DC power connection port.

The input structures 14 may include the various devices, circuitry, and pathways by which user input or feedback is provided to the processor 16. Such input structures 14 may be configured to control a function of the device 8, applications running on the device 8, and/or any interfaces or devices connected to or used by the electronic device 8. For example, the input structures 14 may allow a user to navigate a displayed user interface or application interface. Examples of the input structures 14 may include buttons, sliders, switches, control pads, keys, knobs, scroll wheels, keyboards, mice, touchpads, and so forth.

In certain embodiments, an input structure 14 and display 10 may be provided together, such as in the case of a touch-screen where a touch sensitive mechanism is provided in conjunction with the display 10. In such embodiments, the user may select or interact with displayed interface elements via the touch sensitive mechanism. In this way, the displayed interface may provide interactive functionality, allowing a user to navigate the displayed interface by touching the display 10.

User interaction with the input structures 14, such as to interact with a user or application interface displayed on the display 10, may generate electrical signals indicative of the user input. These input signals may be routed via suitable pathways, such as an input hub or bus, to the processor(s) 16 for further processing.

The processor(s) 16 may provide the processing capability to execute the operating system, programs, user and application interfaces, and any other functions of the electronic device 8. The processor(s) 16 may include one or more microprocessors, such as one or more "general-purpose" microprocessors, one or more special-purpose microprocessors and/or ASICS, or some combination of such processing components. For example, the processor 16 may include one or more reduced instruction set (RISC) processors, as well as graphics processors, video processors, audio processors, and/or related chip sets.

The instructions or data to be processed by the processor(s) 16 may be stored in a computer-readable medium, such as a memory 18. Such a memory 18 may be provided as a volatile memory, such as random access memory (RAM), and/or as a non-volatile memory, such as read-only memory (ROM). The memory 18 may store a variety of information and may be used for various purposes. For example, the memory 18 may store firmware for the electronic device 8 (e.g., such as a basic input/output instruction or operating system instructions), various programs, applications, or routines executed on the electronic device 8, user interface functions, processor functions, and so forth. In addition, the memory 18 may be used for buffering or caching during operation of the electronic device 8.

The components may further include other forms of computer-readable media, such as a non-volatile storage 20, for persistent storage of data and/or instructions. The non-volatile storage 20 may include flash memory, a hard drive, or any other optical, magnetic, and/or solid-state storage media. The non-volatile storage 20 may be used to store firmware, data files, software, wireless connection information, and any other suitable data.

The embodiment illustrated in FIG. 1 may also include one or more card or expansion slots. The card slots may be configured to receive an expansion card 22 that may be used to add functionality, such as additional memory, I/O functionality, or networking capability, to the electronic device 8.

Such an expansion card 22 may connect to the device through any type of suitable connector, and may be accessed internally or external to the housing of the electronic device 8. For example, in one embodiment, the expansion card 22 may be flash memory card, such as a SecureDigital (SD) card, mini- or microSD, CompactFlash card, Multimedia card (MMC), or the like.

The components depicted in FIG. 1 also include a network device 24, such as a network controller or a network interface card (NIC). In one embodiment, the network device 24 may be a wireless NIC providing wireless connectivity over any 802.11 standard or any other suitable wireless networking standard. The network device 24 may allow the electronic device 8 to communicate over a network, such as a Local Area Network (LAN), Wide Area Network (WAN), or the Internet. Further, the electronic device 8 may connect to and send or receive data with any device on the network, such as portable electronic devices, personal computers, printers, and so forth. Alternatively, in some embodiments, the electronic device 8 may not include a network device 24. In such an embodiment, a NIC may be added as an expansion card 22 to provide similar networking capability as described above.

Further, the components may also include a power source 26. In one embodiment, the power source 26 may be one or more batteries, such as a lithium-ion polymer battery or other type of suitable battery. The battery may be user-removable or may be secured within the housing of the electronic device 8, and may be rechargeable. Additionally, the power source 26 may include AC power, such as provided by an electrical outlet, and the electronic device 8 may be connected to the power source 26 via a power adapter. This power adapter may also be used to recharge one or more batteries if present.

With the foregoing in mind, FIG. 2 illustrates an electronic device 8 in the form of a handheld device 30, here a cellular telephone. It should be noted that while the depicted handheld device 30 is provided in the context of a cellular telephone, other types of handheld devices (e.g., such as media players for playing music and/or video, personal data organizers, handheld game platforms, and/or combinations of such devices) may also be suitably provided as the electronic device 8. Further, a suitable handheld device 30 may incorporate the functionality of one or more types of devices, such as a media player, a cellular phone, a gaming platform, a personal data organizer, and so forth.

For example, in the depicted embodiment, the handheld device 30 is in the form of a cellular telephone that may provide various additional functionalities (such as the ability to take pictures, record audio and/or video, listen to music, play games, and so forth). As discussed with respect to the general electronic device of FIG. 1, the handheld device 30 may allow a user to connect to and communicate through the Internet or through other networks, such as LANs or WANs. The handheld electronic device 30, may also communicate with other devices using short-range connections, such as Bluetooth and near field communication. By way of example, the handheld device 30 may be a model of an iPod® or iPhone® available from Apple Inc. of Cupertino, Calif.

In the depicted embodiment, the handheld device 30 includes an enclosure or body that protects the interior components from physical damage and shields them from electromagnetic interference. The enclosure may be formed from any suitable material such as plastic, metal or a composite material and may allow certain frequencies of electromagnetic radiation to pass through to wireless communication circuitry within the handheld device 30 to facilitate wireless communication.

In the depicted embodiment, the enclosure includes user input structures 14 through which a user may interface with the device. Each user input structure 14 may be configured to help control a device function when actuated. For example, in a cellular telephone implementation, one or more of the input structures 14 may be configured to invoke a "home" screen or menu to be displayed, to toggle between a sleep and a wake mode, to silence a ringer for a cell phone application, to increase or decrease a volume output, and so forth.

In the depicted embodiment, the handheld device 30 includes a display 10 in the form of an LCD 32. The LCD 32 may be used to display a graphical user interface (GUI) 34 that allows a user to interact with the handheld device 30. The GUI 34 may include various layers, windows, screens, templates, or other graphical elements that may be displayed in all, or a portion, of the LCD 32. Generally, the GUI 34 may include graphical elements that represent applications and functions of the electronic device. The graphical elements may include icons 36 and other images representing buttons, sliders, menu bars, and the like. The icons 36 may correspond to various applications of the electronic device that may open upon selection of a respective icon 36. Furthermore, selection of an icon 36 may lead to a hierarchical navigation process, such that selection of an icon 36 leads to a screen that includes one or more additional icons or other GUI elements. The icons 36 may be selected via a touch screen included in the display 10, or may be selected by a user input structure 14, such as a wheel or button. It should be noted that, in certain embodiments, the display 10 may be an OLED display rather than an LCD 32.

The handheld electronic device 30 also may include various input and output (I/O) ports 12 that allow connection of the handheld device 30 to external devices. For example, one I/O port 12 may be a port that allows the transmission and reception of data or commands between the handheld electronic device 30 and another electronic device, such as a computer. Such an I/O port 12 may be a proprietary port from Apple Inc. or may be an open standard I/O port.

In addition to handheld devices 30, such as the depicted cellular telephone of FIG. 2, an electronic device 8 may also take the form of a computer or other type of electronic device. Such computers may include computers that are generally portable (such as laptop, notebook, and tablet computers) as well as computers that are generally used in one place (such as conventional desktop computers, workstations and/or servers). In certain embodiments, the electronic device 8 in the form of a computer may be a model of a MacBook®, MacBook® Pro, MacBook Air®, iMac®, Mac® mini, Mac Pro®, or iPad® available from Apple Inc. By way of example, an electronic device 8 in the form of a laptop computer 50 is illustrated in FIG. 3 in accordance with one embodiment. The depicted computer 50 includes a housing 52, a display 10 (such as the depicted LCD 32), input structures 14, and input/output ports 12.

In one embodiment, the input structures 14 (such as a keyboard and/or touchpad) may be used to interact with the computer 50, such as to start, control, or operate a GUI or applications running on the computer 50. For example, a keyboard and/or touchpad may allow a user to navigate a user interface or application interface displayed on the LCD 32.

As depicted, the electronic device 8 in the form of computer 50 may also include various input and output ports 12 to allow connection of additional devices. For example, the computer 50 may include an I/O port 12, such as a USB port or other port, suitable for connecting to another electronic device, a projector, a supplemental display, and so forth. In addition, the computer 50 may include network connectivity, memory, and storage capabilities, as described with respect to FIG. 1. As a result, the computer 50 may store and execute a GUI and other applications.

It should be noted that the electronic device 8 having the presently disclosed display may include devices other than those discussed as examples. Further, the electronic device may also include any device having a display 10 (e.g., mid-size display, large-size display) such as a television, a stand-alone display device, and so forth.

Figure 4:
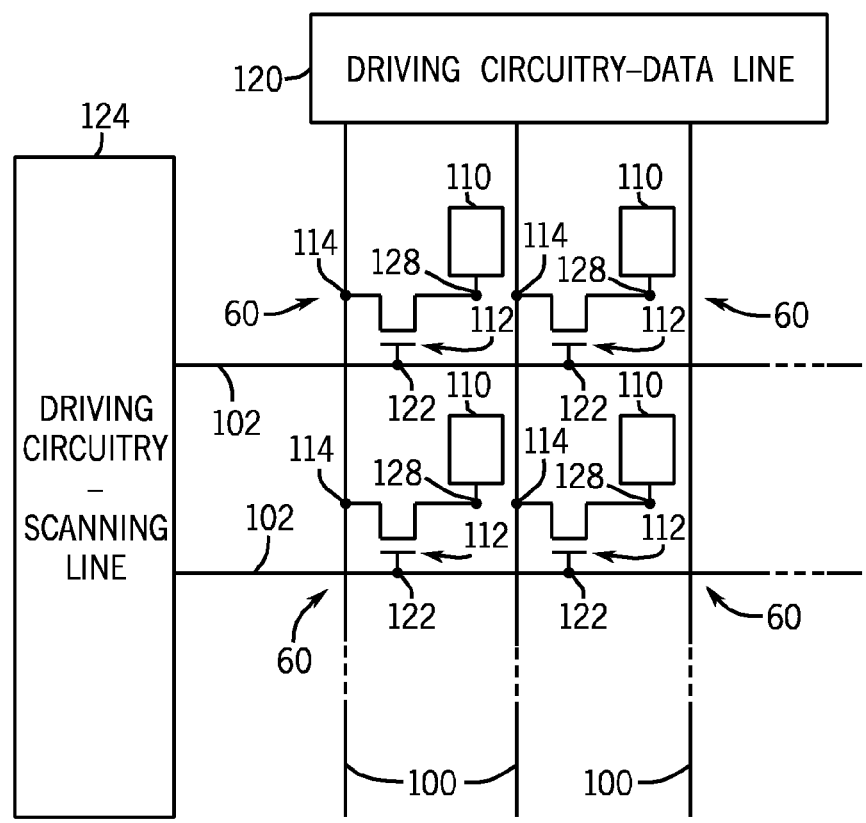
FIG. 4 is a circuit diagram of switching and display circuitry of LCD pixels, in accordance with aspects of the present disclosure.

Referring now to FIG. 4, an example of a circuit view of pixel driving circuitry that may be found in such displays 10 is provided. For example, such circuitry as depicted in FIG. 4 may be embodied in a thin film transistor (TFT) layer of the display. As depicted, pixels 60 of the display 10 may be disposed in a matrix that forms an image display region of the display 10. In such a matrix, each pixel 60 may be defined by the intersection of data lines 100 and scanning or gate lines 102.

Each pixel 60 includes a pixel electrode 110 and a TFT 112 for switching the pixel electrode 110. In the depicted embodiment, a source 114 of each TFT 112 is electrically connected to a data line 100, extending from respective data line driving circuitry 120. Similarly, in the depicted embodiment, a gate 122 of each TFT 112 is electrically connected to a scanning or gate line 102, extending from respective scanning line driving circuitry 124. In the depicted embodiment, the pixel electrode 110 is electrically connected to a drain 128 of the respective TFT 112.

In one embodiment, the data line driving circuitry 120 sends image signals to the pixels 60 via the respective data lines 100. Such image signal may be applied by line-sequence, i.e., the data lines 100 may be sequentially activated during operation. The scanning lines 102 may apply scanning signals from the scanning line driving circuitry 124 to the gate 122 of each TFT 112 to which the respective scanning lines 102 connect. Such scanning signals may be applied by line-sequence with a predetermined timing and/or in a pulsed manner.

Each TFT 112 serves as a switching element which may be activated and deactivated for a predetermined period based on the respective presence of a scanning signal at the gate 122 of the TFT 112. When activated, a TFT 112 may store the image signals received via a respective data line 100 as a charge in the pixel electrode 110 with a predetermined timing.

Figure 5:
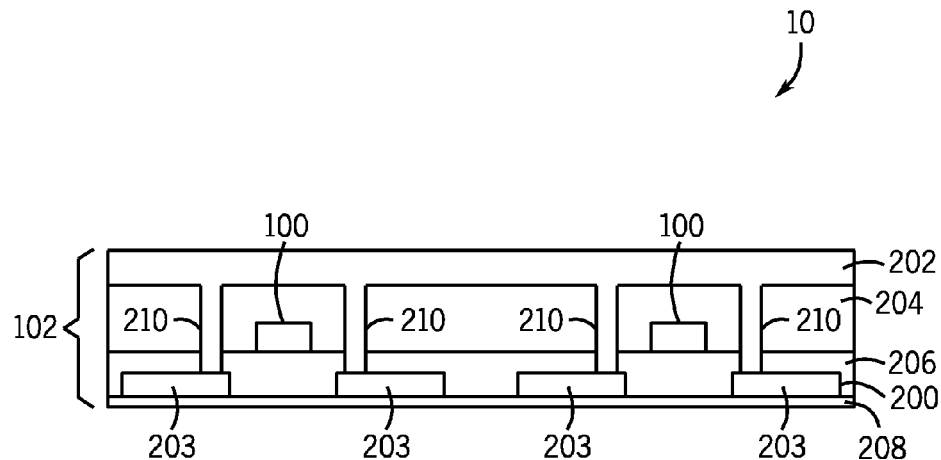
FIG. 5 is a cross-sectional view of an embodiment of a gate line having a primary portion and a secondary portion, in accordance with aspects of the present disclosure.

In the present disclosure, to decrease the size of pixel apertures the data lines 100 and/or the gate lines 102 may be made up of two portions, a primary portion and a secondary portion. FIG. 5 illustrates a cross-sectional view of the display 10 with one possible configuration of a gate line 102 having a primary portion 200 and a secondary portion 202. In this embodiment, the primary portion 200 is segmented with multiple segments 203 which are disposed along the direction of the gate line 102. The segments 203 of the primary portion 200 may or may not be coupled to each other within the primary portion 200 layer. In certain embodiments, the segments 203 may be separated by an interlayer dielectric 206, in which the segments 203 are disposed as shown. Further separating the primary portion 200 and the secondary portion 202 is a passivation layer 204 (e.g., substantially non-conductive layer). In the present embodiment, the secondary portion 202 is generally disposed on one side (i.e., the top) of the passivation layer 204, and the interlayer dielectric 206 may be disposed on the opposing side (i.e., the bottom) of the passivation layer 204.

Further, a low temperature polysilicon (LTPS) layer 208 may be disposed below the primary portion 200. As illustrated, the passivation layer 204 may contain one or more vias 210, in which the secondary portion 202 of the gate line 102 may be coupled to the primary portion 200 as shown in FIG. 5. Generally, each of the segments 203 of the primary portion 200 may be coupled to the secondary portion 202 as shown. Thus, each of the segments 203 of the primary portion 200 and the secondary portion 202 are conductively coupled. As such, signals sent from the scanning line driving circuitry 124 may be carried by both the primary portion 200 of the gate line 102 as well as the secondary portion 202 of the gate line 102. Thus, the primary portion 200 of the gate line 102 may be smaller in width in the present embodiment than in conventional displays. The increase in resistance that would have been created from decreasing the width of the primary portion 200 may be compensated by the addition of the secondary portion 202. Further, as the secondary portion 202 is generally disposed vertically over the primary portion 200, the secondary portion 202 may not add to the width of the gate line 102.

In the embodiment of FIG. 5, the secondary portion 202 includes one segment that travels along the entire length of the gate line 102 with vias 210 in the passivation layer 204 that couple the secondary portion 202 to the primary portion 200. Further, in the present embodiment, the data lines 100 may be disposed in the passivation layer 204 perpendicular to the gate line 102 and between the primary portion 200 of the gate line 102 and the secondary portion 202 of the gate line 102.

Figure 6:
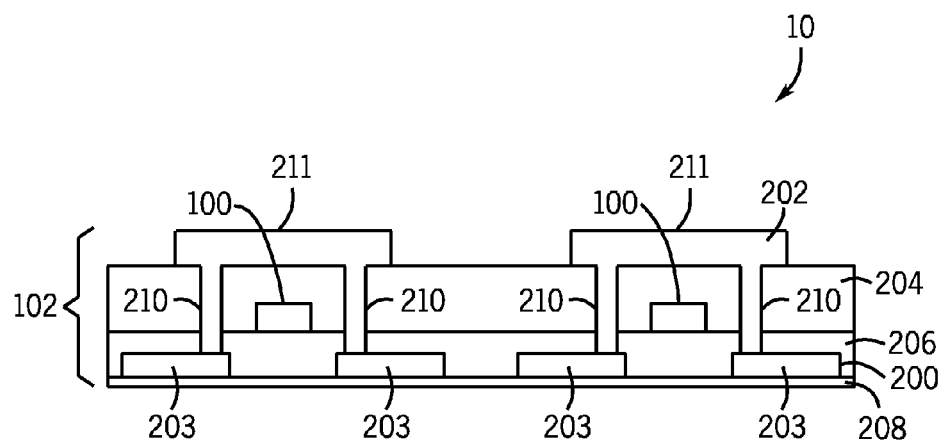
FIG. 6 is a cross-sectional view of another embodiment of a gate line having a primary portion and a secondary portion, in accordance with aspects of the present disclosure.

Another embodiment of the disclosed techniques is illustrated in FIG. 6. Specifically, FIG. 6 illustrates the gate line 102 in which the secondary portion 202 is separated into segments 211 rather than one continuous gate line 102, as in FIG. 5. Each segment 211 of the secondary portion 202 of this embodiment generally forms a bridge-like structure in which each end of the segment 211 couples to a segment 203 of the primary portion 200 using vias 210 in the passivation layer 204. Thus, signals from the scanning line driving circuitry 124 may travel through a first segment 203 of the primary portion 200, then a segment 211 of the secondary portion, then a second segment 203 of the primary portion 200, as shown.

In some embodiment, such as those of FIGS. 5 and 6, the primary portion 200 and the secondary portion 202 of the gate line 102 may be formed using different materials. For example, the primary portion 200 may be formed using Molybdenum while the secondary portion may be formed using a metal having a lower resistance, such as copper or aluminum. Further, the data lines 100 may be formed from a third metal. In certain embodiments, the width of the secondary portion 202 may be generally less than or equal to the width of the primary portion 200.

Figure 7:
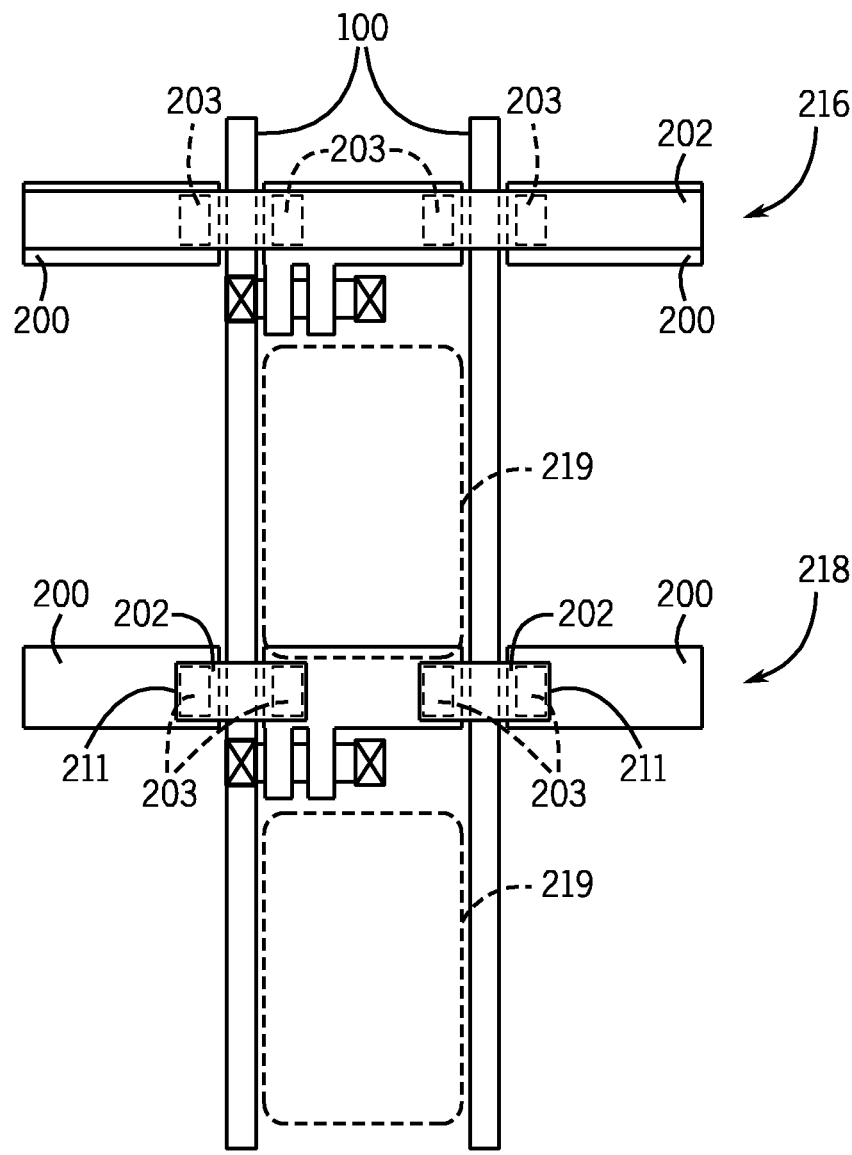
FIG. 7 is a top view of the embodiments of FIGS. 5 and 6, in accordance with aspects of the present disclosure.

A top view of the embodiments of FIGS. 5 and 6 is illustrated in FIG. 7. Specifically, a gate line 216 illustrates a top view of the embodiment of FIG. 5. Accordingly, the secondary portion 202 is illustrated as being formed over the primary portion 200. Further, the secondary portion 202 extends along the full length of the primary portion 200, as illustrated. In contrast, a gate line 218 illustrates a top view of the embodiment of FIG. 6. Again, the secondary portion 202 is illustrated as being formed over the primary portion 200. However, with the gate line 218, the secondary portion 202 is formed using the segments 211. Using either the embodiment of FIG. 5 or the embodiment of FIG. 6, the width of the gate lines 216 and 218 may be smaller than the width of a conventional gate line 102. As a result, a size of a pixel aperture 219 is larger than a size of a conventional pixel aperture.

Figure 8:
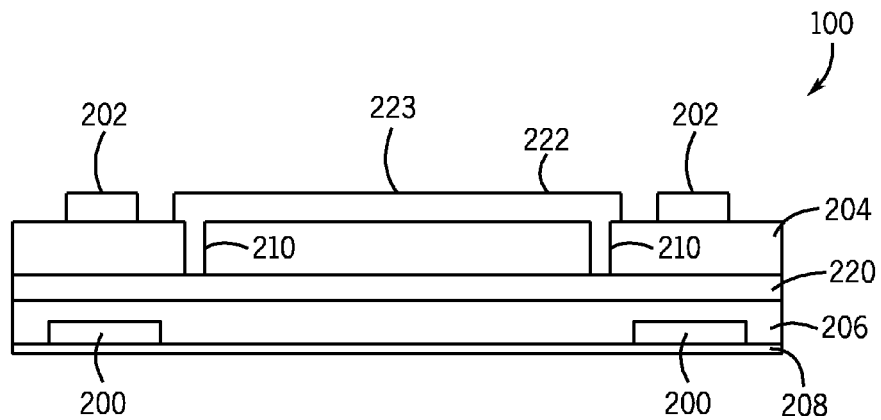
FIG. 8 is a cross-sectional view of an embodiment of a data line having a primary portion and a secondary portion, in accordance with aspects of the present disclosure.

As mentioned previously, in some embodiments, the data line 100 may also include a primary portion and a secondary portion. FIG. 8 illustrates an embodiment in which the data line 100 includes a primary portion 220 and a secondary portion 222. In this embodiment, the primary portion 220 of the data line 100 is disposed between the passivation layer 204 and the interlayer dielectric 206. As the primary portion 200 of the gate line 102 is disposed in the interlayer dielectric 206, the primary portion 220 of the data line 100 may be disposed vertically over the primary portion 220 of the gate line 102. In the present embodiment, the primary portion 220 of the data line 100 is one continuous line that travels across the entire data line 100. However, the secondary portion 222 of the data line 100 may include one or more segments 223 that are less than or equal to the distance between two parallel gate lines 102. The segment 223 may be coupled to the primary portion 220 using vias 210 in the passivation layer 204.

In the present embodiment, the secondary portion 222 of the data line 100 may be disposed vertically over the passivation layer 204. Furthermore, the secondary portion 222 of the data line 100 may be disposed in the same layer as the secondary portion 202 of the gate line 102. In some embodiments, the primary portion 220 and the secondary portion 222 of the data line 100 may be formed using different materials. For example, the primary portion 220 may be formed using molybdenum, while the secondary portion 222 may be formed using a metal of a lower resistance, such as copper or aluminum. Further, the portion 200 may be formed from a third metal. Furthermore, the width of the secondary portion 222 may be generally less than or equal to the width of the primary portion 220.

Figure 9:
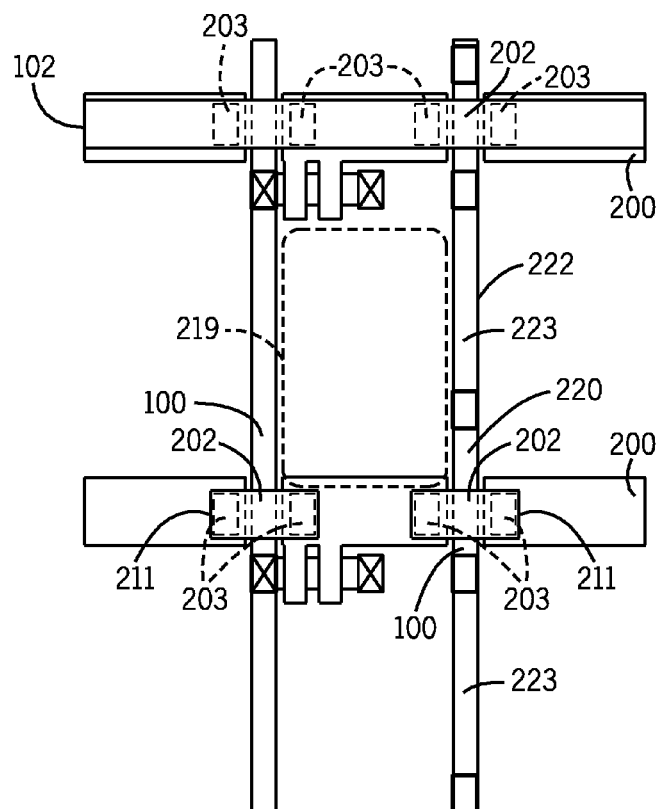
FIG. 9 is a top view of the embodiment of FIG. 8, in accordance with aspects of the present disclosure.

A top view of the embodiment of FIG. 8 is illustrated in FIG. 9. The secondary portion 222 is illustrated as being formed over the primary portion 220. With the data line 100, the secondary portion 202 is formed using the segment 223. Using either the embodiment of FIG. 8, the width of the data line 100 may be smaller than the width of a conventional data line 100. As a result, a size of the pixel aperture 219 is larger than a size of a conventional pixel aperture.

Figure 10:
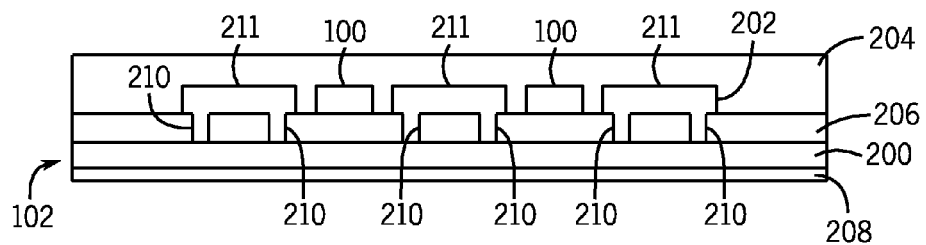
FIGS. 10-12 are cross-sectional views of embodiments of a gate line having a primary portion and a secondary portion, in which the secondary portion is disposed in the same layer as a data line, in accordance with aspects of the present disclosure.

In some embodiments, only one of the data line 100 and the gate line 102 may include a primary portion and a secondary portion. For example, when using LTPS the gate lines 102 may be formed using a first metal, and the data lines 100 and gate bridges may be formed from a second metal. In certain embodiments, molybdenum may be used to form the gate lines 102. In such embodiments, the resistance of the gate lines 102 may be high resulting in a high RC delay. Accordingly, FIG. 10 illustrates an embodiment in which only the gate line 102 includes a primary portion 200 and a secondary portion 202. In this embodiment, the primary portion 200 is generally a continuous line that runs across the entire gate line 102. The secondary portion 202, however, is made up of several segments 211. Each segment 211 forms a bridge-like structure in which each end of each segment 211 is coupled to the primary portion 200 using vias 210 in the interlayer dielectric layer 206, as shown. In this embodiment, the secondary portion 202 is disposed within the passivation layer 204 rather than vertically over the passivation layer 204. Further, the secondary portion 202 may be disposed in the same layer as the data line 100. In such an embodiment, the secondary portion 202 (e.g., gate bridge) may be formed using the same material as the data line 100. As such, the secondary portion 202 of the gate line 102 as well as the data line 100 may be formed in the same step. As such, a first metal (e.g., molybdenum) may be used to form the primary portion 200, and a second metal (e.g., copper, aluminum) may be used to form the secondary portion 202. Thus, the resistance of metal routings may be decreased, while the number of masks used to form such an embodiment does not increase as compared to other formation techniques.

Figure 11:
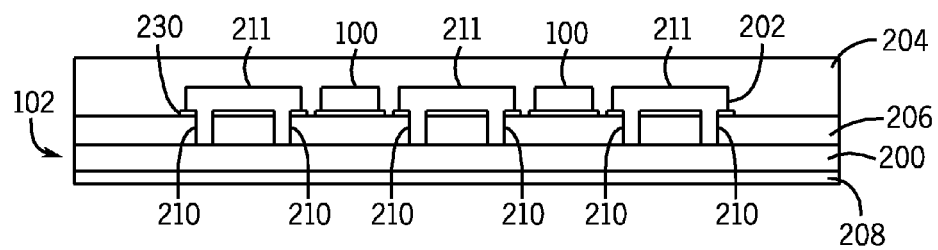

FIG. 11 illustrates an embodiment similar to FIG. 10. Specifically, in FIG. 11, the secondary portion 202 of the gate line 102 as well as the data line 100 may be separated from the interlayer dielectric 206 by a contact barrier layer 230 such as an indium tin oxide (ITO) layer. The contact barrier layer 230 may aid in forming the secondary portion 202 of the gate line 102 as well as the data line 100 by acting as an etch stop layer.

Figure 12:
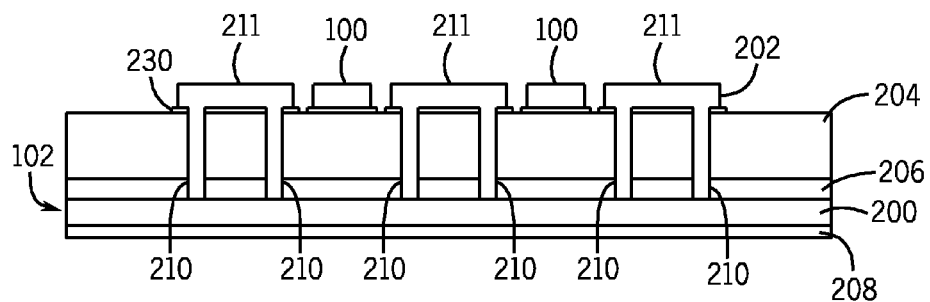

Additionally, FIG. 12 illustrates an embodiment in which the secondary portion 202 of the gate line 102 as well as the data line 100 are disposed in the same layer, vertically over the passivation layer 204. In this embodiment, the secondary portion 202 of the gate line 102 as well as the data line 100 may be separated from the passivation layer 204 by the contact barrier layer 230.

FIGS. 5-12 illustrate a subset of possible configurations of gate lines 102 and data lines 100 having primary and secondary portions. One or more layers of the display 10 may be etched and/or formed individually, or concurrently, depending of the type of mask used in the deposition process. For example, in FIGS. 10-12, secondary portions 202 of the gate line 102 as well as the data line 100 may be formed concurrently and may be made of the same material.

Figure 13:
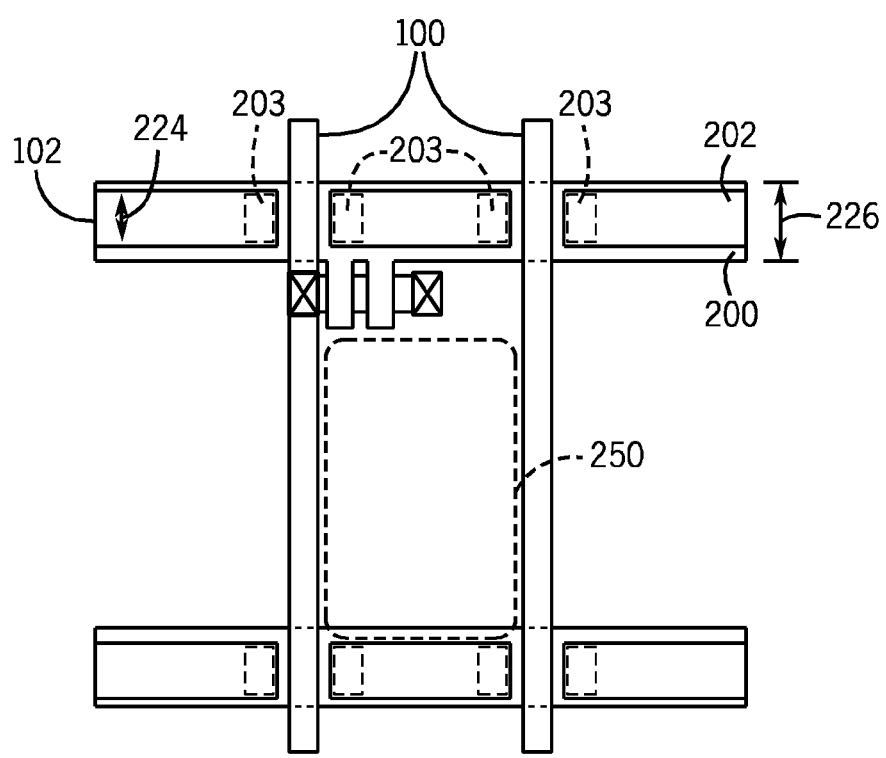
FIG. 13 is a top view of the embodiments of FIGS. 10-12, in accordance with aspects of the present disclosure.

Generally, in these embodiments, the width of the data lines 100 and/or gate lines 102 are reduced, producing a larger pixel aperture area (e.g., size). Specifically, in certain embodiments, the width may be reduced from approximately 20 micrometers to 5 micrometers, allowing for a reduction of 75%. Thus, in certain embodiments, at least one of the pixel aperture length or width may increase by approximately 15 micrometers. Furthermore, in some embodiments, the pixel aperture area may be increased by approximately 10% to 20%. FIG. 13 illustrates such effects from a top perspective of the embodiments of FIGS. 10-12. In the illustrated embodiment, the secondary portion 202 of the gate line has a smaller width 224 than a width 226 of the primary portion 200 of the gate line 102. However, as the secondary portion 202 is disposed vertically above the primary portion 200, the overall width of the gate line 102 is only as wide as the width 226 of the primary portion 200. Accordingly, the width of the gate line 102 of the present disclosure is smaller than the width of a conventional gate line 102. As a result, a size of a pixel aperture 250 of the present embodiment is larger than a size of a conventional pixel aperture.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display comprising:
   a gate line;
   a data line, wherein at least one of the gate line and the data line comprises a first portion and a second portion, and wherein the first portion is disposed in a first layer and the second portion is disposed in a second layer; and
   a passivation layer disposed between the first portion and the second portion, wherein the passivation layer comprises one or more vias that conductively couple the second portion to the first portion, wherein the first portion comprises a first material, and the second portion comprises a second material, wherein the first material comprises molybdenum and the second material comprises copper.

2. The display of claim 1, wherein a width of at least one of the gate line and the data line is approximately 5 micrometers.

3. The display of claim 1, wherein the first portion comprises a plurality of first segments, wherein each of the plurality of first segments is coupled to the second portion by one of the one or more vias in the passivation layer.

4. The display of claim 1, wherein the second portion comprises a plurality of second segments and each of the plurality of second segments is coupled to the first portion by the one or more vias in the passivation layer.

5. The display of claim 1, wherein the display comprises at least one of a liquid crystal display (LCD) and an organic light emitting diode (OLED) display.

6. The display of claim 1, wherein the first portion is at least as wide as the second portion.

7. A display comprising:
  a gate line;
  a data line, wherein at least one of the gate line and the data line comprises a first portion and a second portion, and wherein the first portion is disposed in a first layer and the second portion is disposed in a second layer;
  a passivation layer disposed between the first portion and the second portion, wherein the passivation layer comprises one or more vias that conductively couple the second portion to the first portion; and
  a conductive barrier layer disposed between the second portion and the passivation layer.

8. A display comprising:
  a gate line;
  a data line, wherein at least one of the gate line and the data line comprises a first portion and a second portion, and wherein the first portion is disposed in a first layer and the second portion is disposed in a second layer;
  a passivation layer disposed between the first portion and the second portion, wherein the passivation layer comprises one or more vias that conductively couple the second portion to the first portion, wherein the gate line comprises the first portion and the second portion, and wherein the second portion of the gate line is disposed in the same layer as the data line.

9. The display of claim 8, wherein the second portion of the gate line and the data line comprise the same material.

10. An electronic device comprising:
  a display comprising:
    a gate line, wherein the gate line comprises a first portion and a second portion, and wherein the first portion is disposed in a first layer and the second portion is disposed in a second layer;
    a data line; and
    a substantially non-conductive layer disposed between the first portion and the second portion, wherein the substantially non-conductive layer comprises one or more vias that conductively couple the second portion to the first portion, wherein at least one of the first portion and the second portion comprises a plurality of segments, the first portion comprises a first material and the second portion comprises a second material, and the second material has a lower resistance than the first material.

11. The electronic device of claim 10, wherein the first portion comprises a plurality of first segments, wherein each of the plurality of first segments is coupled to the second portion by one of the one or more vias in the substantially non-conductive layer.

12. The electronic device of claim 10, wherein the display comprises at least one of a liquid crystal display (LCD) and an organic light emitting diode (OLED) display.

* * * * *